United States Patent [19]
Imaizumi et al.

[11] 3,850,708
[45] Nov. 26, 1974

[54] METHOD OF FABRICATING SEMICONDUCTOR DEVICE USING AT LEAST TWO SORTS OF INSULATING FILMS DIFFERENT FROM EACH OTHER

[75] Inventors: Ichiro Imaizumi; Tadao Kaji; Akio Hayasaka, all of Kokubunji; Keijiro Uehara, Kita, all of Japan

[73] Assignee: Hitachi, Ltd., Tokyo, Japan

[22] Filed: Oct. 29, 1971

[21] Appl. No.: 193,854

[30] Foreign Application Priority Data

Oct. 30, 1970 Japan .............................. 45-95083

[52] U.S. Cl. .............................. 148/187, 148/1.5
[51] Int. Cl. .............................. H01l 7/44
[58] Field of Search .............................. 148/175, 187

[56] References Cited

UNITED STATES PATENTS

| | | | |
|---|---|---|---|
| 3,326,729 | 6/1969 | Sigler | 148/175 |
| 3,342,650 | 9/1967 | Seki et al. | 148/187 |
| 3,475,234 | 10/1969 | Kerwin et al. | 148/187 |
| 3,537,921 | 10/1970 | Boland | 148/187 |
| 3,544,399 | 12/1970 | Dill | 148/187 |
| 3,576,478 | 4/1971 | Watkins et al. | 148/175 X |

FOREIGN PATENTS OR APPLICATIONS

| | | | |
|---|---|---|---|
| 1,614,375 | 5/1970 | Germany | 148/187 |

*Primary Examiner*—L. Dewayne Rutledge
*Assistant Examiner*—J. Davis
*Attorney, Agent, or Firm*—Craig & Antonelli

[57] ABSTRACT

A graft base transistor or the like is made by the steps of forming a first, preferably frame-shaped diffusion mask on a first base region doped with boron at an impurity concentration of $10^{18}cm^{-3}$, using a nitrided film ($Si_3N_4$); diffusing boron at an impurity concentration of $2 \times 10^{20}cm^{-3}$ through this mask to form the second base region in the first base region; thereafter forming an oxide film ($SiO_2$) on a region except where this mask is left; removing the remaining nitrided film and thus forming a second diffusion mask; and diffusing phosphor at an impurity concentration of $10^{20}cm^{-3}$ through the second diffusion mask, whereby the graft base transistor has an emitter, the surface area of which is smaller than the opening area of the second diffusion mask.

4 Claims, 27 Drawing Figures

INVENTORS
ICHIRO IMAIZUMI, TADAO KAJI,
AKIO HAYASAKA, KEIJIRO UEHARA
BY Craig, Antonelli & Hill
ATTORNEYS INVENTORS
ICHIRO IMAIZUMI, TADAO KAJI,
AKIO HAYASAKA, KEIJIRO UEHARA
BY Craig, Antonelli & Hill
ATTORNEYS INVENTORS
ICHIRO IMAIZUMI, TADAO KAJI,
AKIO HAYASAKA, KEIJIRO UEHARA
BY Craig, Antonelli & Hill
ATTORNEYS

METHOD OF FABRICATING SEMICONDUCTOR DEVICE USING AT LEAST TWO SORTS OF INSULATING FILMS DIFFERENT FROM EACH OTHER

BACKGROUND OF THE INVENTION

1. Field of the Invention

The present invention relates to a method of fabricating a semiconductor device, and more particularly to a method of fabricating a semiconductor device which uses at least two insulating films.

2. Description of the Prior Art

In methods of fabricating a semiconductor device which includes within an impurity diffusion region of a predetermined conductivity type, an impurity diffusion region of the opposite conductivity type, one has heretofore used the graft base transistor process in order, for example, to narrowly form the width of the emitter region of a bipolar transistor. As a concrete example of this process, U.S. Pat. application Ser. No. 517,648, now abandoned, describes a method of fabricating a semiconductor device, which method comprises the steps of forming an oxide film on a silicon substrate, forming a frame-shaped opening mask in the oxide film, performing the first impurity diffusion of high-concentration P-type impurities into the substrate through this mask, forming an oxide film to cover the opening portion, forming the second opening mask in the central mask portion of the frame-shaped opening mask, performing the second impurity diffusion of P-type impurities through the second opening mask, and performing the third impurity diffusion of high-concentration N-type impurities using the second opening mask "as is," so as to form the emitter of the semiconductor device.

With the above-mentioned method, however, it is necessary for the second impurity diffusion or the third impurity difusion for the emitter region to process the oxide diffusion to make the second opening mask, and a mask mis-register may occur in case of the mask positioning between the second mask and a base region with high concentration as has already been formed by the first impurity diffusion, thus making it impossible to form the emitter width narrowly and precisely.

SUMMARY OF THE INVENTION

An object of the present invention is to provide a method of fabricating a semiconductor device, which eliminates the above-mentioned disadvantages, which eliminates the danger of mask mis-register or misalignment and which permits to carry out the formation of impurity diffusion regions with good precision.

Another object of the present invention is to provide a method of fabricating a semiconductor device, which reduces the mask registering or aligning steps.

Still another object of the present invention is to provide a method of fabricating a semiconductor device, which permits to make small the area occupied by a transistor.

A method of the present invention for accomplishing the above-mentioned objects is characterized by performing an impurity diffusion into a substrate through a mask formed of a first insulating film, subsequently forming a second insulating film in the area of an impurity diffusion region formed by the diffusion, and further, removing the first insulating film and using the second insulating film as a diffusion mask to perform another impurity diffusion. The invention will be hereinbelow described in detail with reference to some preferred embodiments and the accompanying drawings.

DESCRIPTION OF THE PREFERRED EMBODIMENTS

Figures 1A, 1B, 1C, 1D, 1E, 1F, 1G, 1H, 1I:
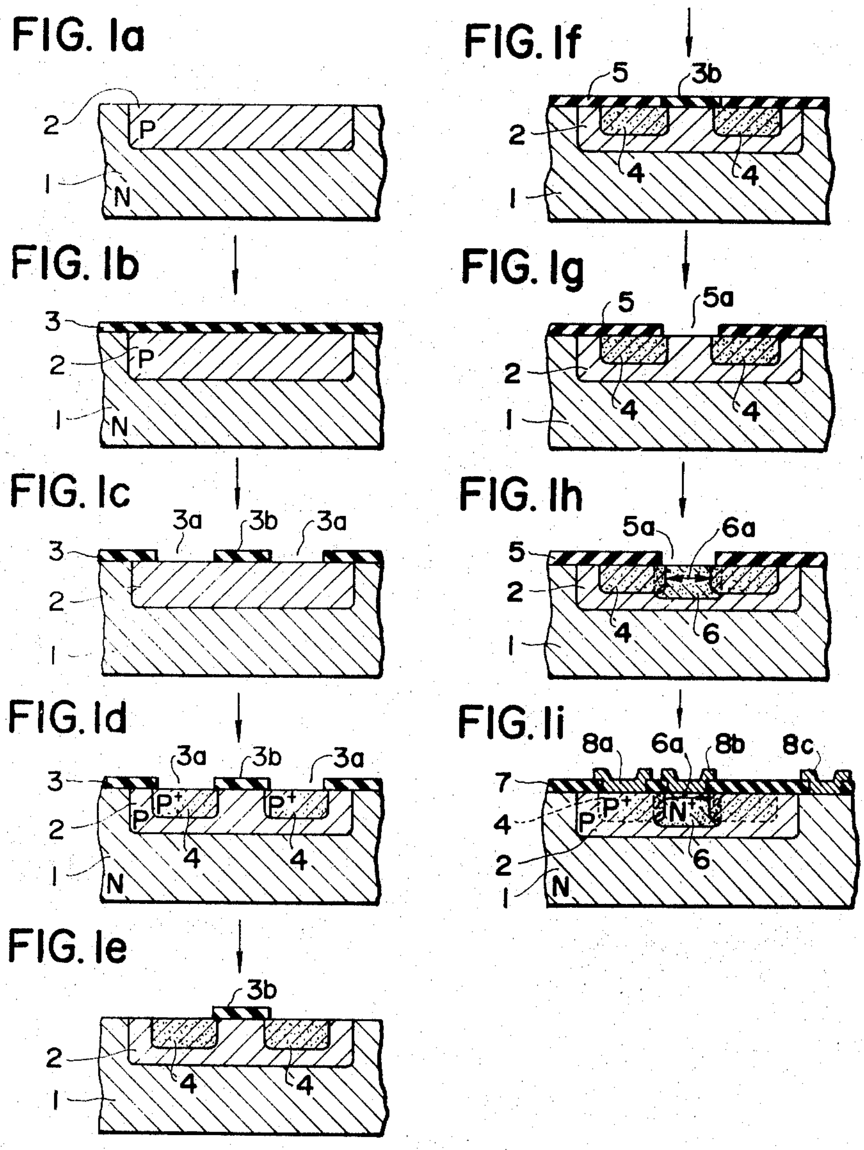
FIGS. 1*a* to 1*i* are diagrams of the fabricating steps of one embodiment of the present invention and showing sections of a graft base transistor.

FIGS. 1*a* to 1*i* are diagrams showing an embodiment of the present invention, and illustrate the fabricating steps of a graft base transistor in which base regions are formed of two regions different in the impurity concentration from each other. First, as shown in FIG. 1*a*, an impurity diffusion region 2 (P-type in which the impurity concentration of boron (B) is about $10^{18}cm^{-3}$ is formed in a silicon substrate 1 (N-type) of a specific resistance of 1Ω cm by any one of the well-known semiconductor fabricating techniques. Subsequently, as as shown in FIG. 1*b*, a nitrided film 3 such as $Si_3N_4$, is formed on the plane surfaces of the substrate 1 and the diffusion region 2. As shown in FIG. 1*c*, using a conventional photo-etching technique for preparing a diffusion mask, a diffusion window 3*a* (which is frame-shaped in the illustrated embodiment) for impurity diffusion is then formed at a predetermined position of the nitrided film 3.

As illustrated in FIG. 1*d*, a diffusion of impurities of the opposite conductivity type (P-type) to that of the substrate, i.e., of boron (B) amounting in the impurity concentration to about $2 \times 10^{20}$ $cm^{-3}$, is carried out to form a high-concentration impurity diffusion region 4. As is well known in connection with the impurity diffusion phenomena, there occurs in that case the so-called "going-round diffusion" in which the diffusion region partially goes around the diffusion window to be diffused inside the mask. As a result, the diffusion region 4 by the described diffusion is formed to be slightly larger in area than the diffusion window 3*a*. The size by which the diffused region goes around is of the same extent as the diffusion depth, and if the junction depth is, for example, 1$\mu$, the "going-round" size also becomes approximately 1$\mu$. Accordingly, a portion of region 2 surrounded by the diffusion region 4 is formed which is narrower by 2$\mu$ than the portion 3*b* of the film 3 surrounded by the frame-shaped diffusion window 3*a*. Thereafter, as shown in FIG. 1*e*, only the nitride film 3*b* covering the portion surrounded by the frame-shaped diffusion window 3*a* is covered using, e.g., the CVD (chemical vapor deposition) oxide-film forming technique and a well-known photo-etching technique. The nitrided film in all regions other than the above-mentioned nitrided film 3*b* is exposed, and the exposed nitrided film is exfoliated and removed by immersing the substrate, thus prepared and treated, into a phosphoric acid solution at a liquid temperature of 180°C, or the like. Next, the substrate thus treated is heated in an oxidizing atmosphere at a temperature of 800° to 1,200°C by a well-known oxide-film forming method, e.g., the thermal oxidation process, and is thus provided with an oxide film 5 as shown in FIG. 1*f*. In this case, since the oxide film is formed by a thermochemical reaction between it and the substrate Si, it is not formed on the nitride film. Thereafter, as shown in FIG. 1*g*, the nitride film is etched and removed. In that connection, only the nitrided film 3*b* is removed by a treatment with chemicals, employing an etching liquid, such as the above-mentioned phosphoric acid, which does not etch the oxide film, and a diffusion mask having a diffusion window 5*a* for formation of an emitter region is formed. To the diffusion window 5*a*, the diffusion region 4 is partially exposed because of the "going round" of the impurities due to the impurity diffusion as described above. Subsequently, an impurity diffusion of phosphorus being the same in the conductivity type as the substrate 1 is carried out through the diffusion mask 5*a* and at an impurity concentration of about $10^{20}cm^{-3}$, and a high-concentration impurity diffusion region 6 serving as an emitter is formed as illustrated in FIG. 1*h*. Since the diffused region 6 is surrounded by the diffused region 4, the PN-junction by the above diffusion is formed to be smaller than the diffusion window 5*a*. For this reason, the width 6*a* of the emitter becomes smaller than that of the diffusion window 5*a*, that is, the surface area of the emitter becomes smaller than that of the diffusion mask used for forming the emitter region. Subsequently, as shown in FIG. 1*i*, the oxide film 5 is removed, whereupon a clean insulating film 7 is formed anew on the substrate 1 and the diffused regions. In addition, using well-known semiconductor fabricating techniques, electrodes 8*a*, 8*b* and 8*c* for the base, emitter and collector, respectively, are provided for the predetermined regions 2, 6 and 1 thereby to constitute the graft base transistor.

As described above, the graft base transistor according to the present steps of manufacture is fabricated in such a manner that a predetermined diffusion mask is used to effect diffusion into a base region, and that a diffusion mask covering regions resulting from the diffusion with an insulating film is subsequently used to effect diffusion. Therefore, the diffusion mask registering steps are made once, and the width of the emitter region 6 may be formed precisely and narrowly.

While, in the foregoing embodiment, the description has been made of the case where two types of masks are treated with different etching liquids, the techniques of the present invention may of course be applied not only to the case of the two masks, but also to a case of using more than two masks. Furthermore, the difffusion masks are not restricted to nitride and oxide films, but may also be formed of other insulating materials of generally known type. Furthermore, it goes without saying that a transistor of narrow emitter width may be formed even when the order of the impurity diffusing steps is changed in such a way that, after the diffusion region 6 is formed, the diffusion region 4 is formed.

Figure 2A:
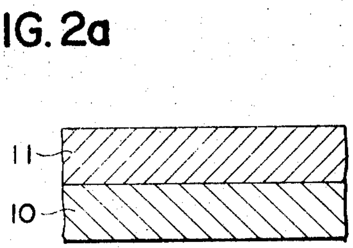
FIGS. 2*a* to 2*i* are diagrams of the fabricating steps of another embodiment of the present invention and showing sections of a lateral transistor.
Figure 2B:
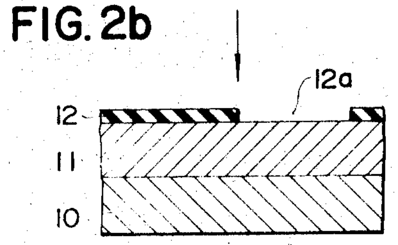
Figure 2C:
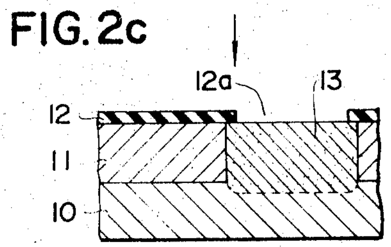
Figure 2D:
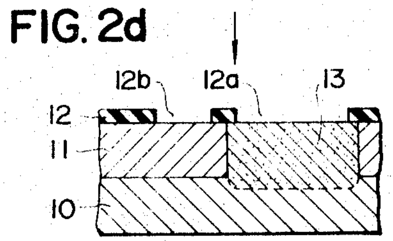
Figure 2E:
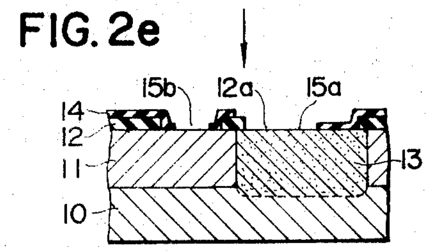
Figure 2F:
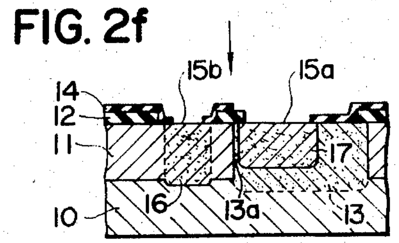
Figure 2G:
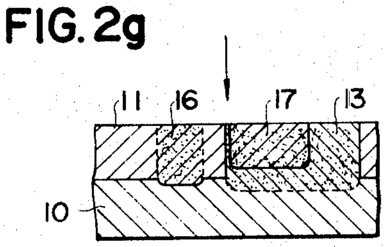
Figure 2H:
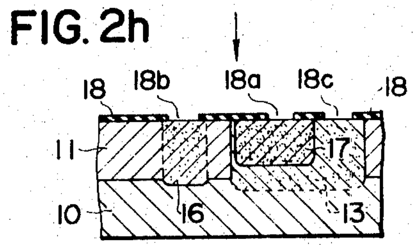
Figure 2I:
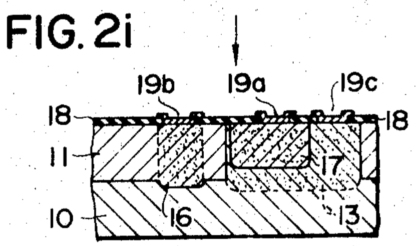

FIGS. 2*a* to 2*i* are diagrams showing another embodiment of the present invention, and illustrate the fabricating steps of a lateral transistor The lateral transistor has its base width narrowly formed by utilizing the so-called diffusion layer which includes, within an impurity diffusion layer of a predetermined conductivity type, an impurity diffusion layer of the opposite conductivity type. It is characterized in that the impurity diffusion is generally carried out in an atmosphere with no oxygen present. First, as shown in FIG. 2*a*, an epitaxial layer 11 (hereinafter referred to as "EP layer") is formed on a substrate 10, the EP layer being opposite in the conductivity type to the substrate 10. As illustrated in FIG. 2*b*, an insulating film 12, e.g., a nitrided film ($Si_3N_4$), formed on the EP layer 11, is formed with a mask hole 12*a* for impurity diffusion using the photo-etching technique. Used as an etching liquid in this case is, for example, phosphoric acid. Subsequently, as shown in FIG. 2*c*, an impurity diffusion region 13 is formed which penetrates through the EP layer 11 to reach the substrate 10 and which is the same conductivity type as that of the substrate. Next, as in FIG. 2*d*, a mask hole 12*b* is formed in a place separate from the diffused region 13. An insulating film, such as an oxide film 14, different in property from the nitrided film 12, is formed on the nitrided film 12 and in the mask holes 12*a* and 12*b* using a chemical deposition process (in general, the chemical vapor deposition), whereupon diffusion masks 15*a* and 15*b* are formed by the photo-etching technique as is illustrated in FIG. 2*e*. In this case, used as an etching liquid for the etching treatment are chemicals, such as fluoric acid, with which only the oxide film 14 is dissolved. With such treatment, the nitride film 12 previously formed is left as mask in the "as is" condition. Therefore, even if the mask hole 15*a* of the oxide film 14 is more or less misaligned, no problem results insofar as the nitride film 12 is partially exposed. Thus, the formation of impurity diffusion regions with predetermined accuracies becomes possible thereby. More specifically, as in FIG. 2*f*, impurities of the opposite conductivity type to that of the substrate are diffused through the diffusion mask holes 15 *a* and 15*b* to form an emitter region 17 and a collector region 16 of high-concentration impurity diffusion portion, respectively. A base region 13*a* is precisely formed by the diffusion self-alignment, with the previously-formed nitride film 12 serving as a mask. Subsequently, as in FIG. 2*g*, the nitride and oxide films having been formed by the above steps are exfoliated and removed. As in FIG. 2*h*, a clean oxide film 18 for the stabilization and protection of the element is formed anew on the substrate and the diffused regions, and mask holes 18*a*, 18*b* and 18*c* for leading out electrodes are formed in the oxide film 18 using the photo-etching technique. Finally, as shown in FIG. 2*i*, terminal lead-out electrodes 19*a*, 19*b* and 19*c* for the emitter, base and collector, respectively, are formed by the evaporation of a metal such as aluminum, to provide the lateral transistor.

The embodiment is characterized in that the semiconductor device is formed in a way in which impurity diffusion is made into a substrate through a mask formed by the first insulating film, the second insulating film different from the first one is subsequently formed on the mask, the formation of holes is suitably carried out, and thereafter, the impurity diffusion or the electrode application is performed.

As described above, the lateral transistor according to the steps of manufacture of this invention has the base region width 13*a* formed by the double diffusion using substantially an identical mask. Therefore, the width of the base region 13*a* may be accurately controlled. In addition, the electrode from the base region 13 can be easily lead out.

Figure 3A:
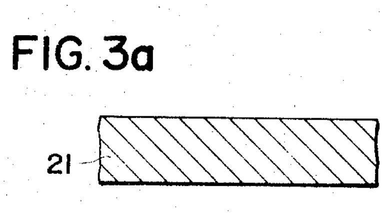
FIGS. 3*a* to 3*i* are diagrams of the fabricating steps of still another embodiment of the present invention and showing sections of a transistor.
Figure 3B:
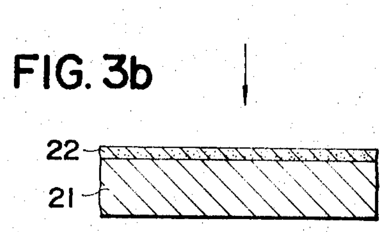
Figure 3C:
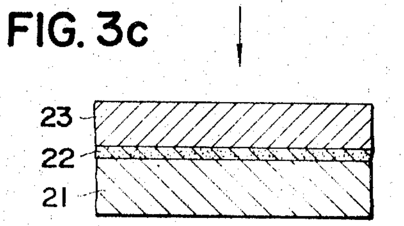
Figure 3D:
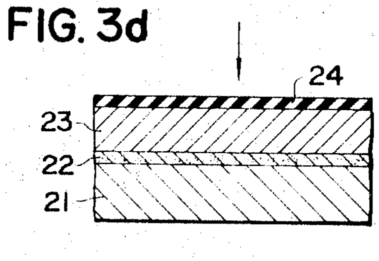
Figure 3E:
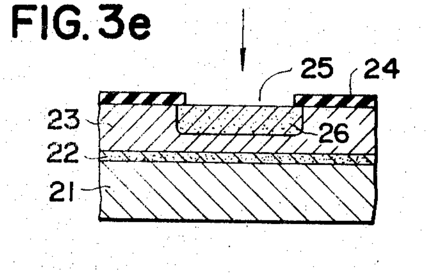
Figure 3F:
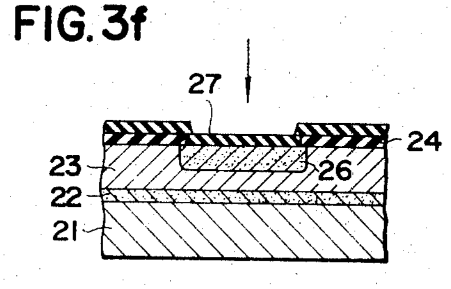
Figure 3G:
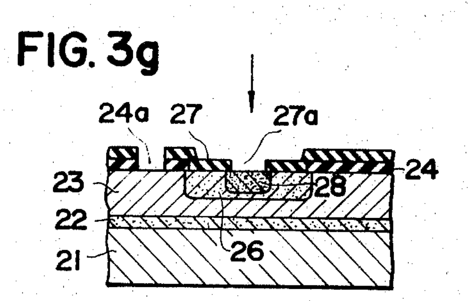
Figure 3H:
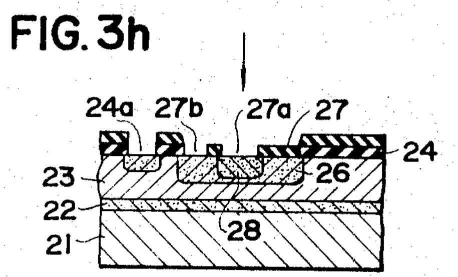
Figure 3I:
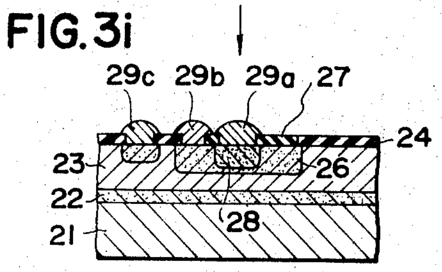

FIGS. 3*a* to 3*i* illustrate a method of fabricating a semiconductor of still another embodiment of the present invention. First, a silicon substrate 21 as shown in FIG. 3a is prepared, which has a specific resistance of 1Ω cm and which is of the P conductivity type. Next, as in FIG. 3b, an impurity diffusion layer 22 of the N conductivity type is formed by the impurity diffusion of phosphorus into the surface of the substrate. Further, as shown in FIG. 3c, an EP layer 23 of the N conductivity type is formed on the impurity diffused layer 22 using a well-known epitaxial growth technique. As illustrated in FIG. 3d, an oxide film 24 is formed on the EP layer 23. Then, as shown in FIG. 3e, the oxide film 24 has a mask hole 25 for impurity diffusion formed therein by the photo-etching technique, and the impurity diffusion of boron of the P conductivity type is effected to form a base region 26. Subsequently, as illustrated in FIG. 3f, an insulating film 27 different in property from the aforesaid oxide film 24, for example, a CVD oxide film 27 formed by the chemical vapor deposition process is provided in the portion of the mask hole 25 and on the oxide film 24. As shown in FIG. 3g, a mask hole 27a for the formation of an emitter region is formed in the CVD oxide film 27 using the photo-etching technique, and impurities of the N conductivity type are diffused to form the emitter region 28. Thereafter, as shown in FIG. 3h, there are formed a mask hole 27b for taking out the base electrode and a mask hole 24a for taking out the collector electrode. Finally, as shown in FIG. 3i, the electrodes 29a, 29b and 29c for leading out terminals from the emitter, base and collector are respectively provided by the metal evaporation of aluminum of the like, to form a transistor for use in a usual semiconductor integrated circuit etc.

The impurity diffusion layer 22 is for reducing the collector resistance, and it is understood that it can be formed not only by the impurity diffusion but also by other processes such as the EP growth. Furthermore a window 24a may be provided already in step 3g to provide a diffused region of high impurity for the subsequent collector contact.

In the step of manufacture as illustrated by FIG. 3h, when the mask hole 27b for the electrode attachment to the base is formed, fluoric acid is used as an etching liquid. It is generally known that, with fluoric acid, the etching speed of the oxide film 24 which has been formed by the thermal oxidation is approximately 7A per second, whereas that of the CVD oxide film 27 is approximately 100A per second. As a result, in this case, even when the CVD oxide film 27 is removed, the oxide film 24 is kept hardly etched because of the etching speed. For this reason, even when the base electrode 29b is disposed in the hole portion 27b, it is not brought into contact with the collector region 23. By using in this manner two types of masks different in the etching speed thereof, the electrode attachment may be carried out with good precison. Accordingly, it becomes unnecessary to previously provide allowances for the areas of masks and to perform positioning of the masks, and the area occupied by the element may be made small.

While, in the foregoing embodiments, description has been made of the case where two types of masks are subjected to etching treatments with different etching liquids and the case where two types of masks different in the etching speed with an identical etching liquid are used, it goes without saying that both cases are applicable to any embodiments. Furthermore, even in case where the two types of masks differ only in thickness, if the thickness of the first mask is sufficiently larger than that of the second mask and the thickness of the second mask is smaller than the diffusion depth, the first mask is hardly decreased even under a condition under which the second mask has been substantially completely etched away. Thus, a state similar to that in the third embodiment is brought about.

It is therefore apparent that the objects of the present invention may be accomplished when the two types of masks differ in material (for example, $SiO_2$, $Si_3N_4$, poly-Si, etc.), when they vary in constituents (for example, the thermal oxidation film, the CVD oxidation film, etc.), or when they differ in thickness. The techniques of the present invention are not restricted to the two types of masks mentioned above, but may of course be applied to a case of using more than two masks.

As described above in detail, the present invention carries out impurity diffusion through a diffusion mask formed by an insulating film, and in addition, uses the diffusion mask to form a mask on the first-mentioned mask or in a mask hole of an insulating film which is different in property from the first-mentioned insulating film, whereby precision impurity diffusion regions or electrode masks may be formed. Thus, the invention is greatly effective in providing a semiconductor device which is high in switching speed, exhibits no short-circuits and has excellent electrical characteristics.

While we have shown and described several embodiments in accordance with the present invention, it is understood that the invention is not limited thereto but is susceptible of numerous changes and modifications as known to those skilled in the art, and we therefore do not wish to be limited to the details shown and described herein but intend to cover all such changes and modifications as are encompassed by the scope of the appended claims.

We claim:

1. A method of fabricating a semiconductor device comprising the steps of:

a. preparing a semiconductor substrate;
b. forming a first insulating layer on said substrate;
c. providing a first mask by forming at least one hole in said first insulating layer, so as to expose a portion of the surface of said substrate;
d. diffusing at least one impurity of a first conductivity type into said substrate through the surface thereof exposed by step (c);
e. forming a second insulating layer on the remaining part of said first insulating layer and the exposed portion of the surface of said substrate, said second insulating layer having a different property from said first insulating layer;
f. providing a second mask by forming at least one hole in said second insulating layer within an area thereof delimited by the hole of said first mask which exposes said portion of the surface of said substrate, so as to expose a part of the surface of said substrate;
g. diffusing at least one impurity of a second conductivity type into said substrate through the surface thereof exposed by step (f);
h. forming another hole in said second insulating layer, said hole being delimited partly by the edge of the hole of said first mask, and
i. forming a metal layer on the portion of the surface of said substrate exposed by step (h).

2. A method of fabricating a semiconductor device according to claim 1, wherein both said insulating layers are $SiO_2$ films, said $SiO_2$ film formed during step (b) being formed by a thermal oxidation process in an oxidizing atmosphere at about 800°C to about 1,200°C, and said $SiO_2$ film formed during step (e) being formed by a chemical deposition process using the thermal decomposition of silane.

3. A method of fabricating a semiconductor device comprising the steps of:

a. forming a first layer of insulating material directly on the surface of a semiconductor substrate, said first layer of insulating material having a first etching speed with respect to a prescribed etchant;

b. forming a first hole through said first layer of insulating material to the surface to said substrate, to expose a first surface portion of said substrate;

c. introducing a first impurity of a first conductivity type through said hole into the exposed surface portion of said substrate;

d. forming a second layer of insulating material directly on the surface of said first layer of insulating material and on the exposed surface of said substrate into which said first impurity has been introduced by step (c), said second layer of insulating material having a second etching speed with respect to said prescribed etchant, said second etching speed being faster than said first etching speed;

e. forming a first hole through a first portion of said second layer of insulating material which is disposed within the first hole provided through said first layer of insulating material, so as to expose a second surface portion of said substrate within the confines of the surface thereof into which said first impurity has been introduced;

f. introducing a second impurity of a second conductivity type, opposite said first conductivity type, through the first hole in said second layer of insulating material into said second surface portion of said substrate;

g. forming a second hole through a second portion of said second layer of insulating material which is disposed within the first hole provided through said first layer of insulating material, so as to expose a third surface portion of said substrate spaced apart from said second surface portion of said substrate and adjacent said first layer of insulating material at the confines of the first hole therethrough, within the confines of the surface thereof into which said first impurity has been introduced, by selectively applying said prescribed etchant to that portion of said second layer of insulating material substantially overlying said third surface portion of said substrate; and h. forming a metal layer on said third surface portion of said substrate through said second hole through said second layer of insulating material.

4. A method of fabricating a semiconductor device according to claim 3, wherein said step (a) comprises the step of thermally oxidizing a silicon substrate in an oxidizing atmosphere at about 800°C to about 1,200°C, and said step (d) comprises the step of forming an insulating layer of silicon dioxide by a chemical vapor deposition process through the thermal decomposition of silane.

* * * * *